United States Patent
Huang et al.

(10) Patent No.: US 7,579,248 B2
(45) Date of Patent: Aug. 25, 2009

(54) RESOLVING PATTERN-LOADING ISSUES OF SIGE STRESSOR

(75) Inventors: Yu-Lien Huang, Jhubei (TW); Jim Huang, Hsinchu (TW); Ling-Yen Yeh, Hsinchu (TW); Hun-Jan Tao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 420 days.

(21) Appl. No.: 11/352,588

(22) Filed: Feb. 13, 2006

(65) Prior Publication Data

US 2007/0190730 A1    Aug. 16, 2007

(51) Int. Cl.
*H01L 21/336* (2006.01)
(52) U.S. Cl. .................. 438/300; 438/229; 257/346; 257/E21.619; 257/E21.634
(58) Field of Classification Search .................. 438/300, 438/229; 257/346, 369, E21.619, E21.634
See application file for complete search history.

(56) References Cited

U.S. PATENT DOCUMENTS

2006/0088968 A1 * 4/2006 Shin et al. .................. 438/299
2006/0115933 A1 * 6/2006 Ye et al. .................. 438/139
2006/0240630 A1 * 10/2006 Bauer et al. .................. 438/301

OTHER PUBLICATIONS

Huang, C.-C., et al., "Design and Integration of Strained SiGe/Si Hetero-Structure CMOS Transistors," IEEE, 2005, pp. 23-24.
Ko, C.H., et al., "A Novel Process-Induced Strained Silicon (PSS) CMOS Technology for High-Performance Applications," IEEE, 2005, pp. 25-26.
Ouyang, Q., et al., "Characteristics of High Performance PFETs with Embedded SiGe Source/Drain and <100> Channels on 45° Rotated Wafers," IEEE, 2005, pp. 27-28.

* cited by examiner

*Primary Examiner*—Douglas M Menz
*Assistant Examiner*—Steven J Fulk
(74) *Attorney, Agent, or Firm*—Slater & Matsil, L.L.P.

(57) ABSTRACT

A method for improving uniformity of stressors of MOS devices is provided. The method includes forming a gate dielectric over a semiconductor substrate, forming a gate electrode on the gate dielectric, forming a spacer on respective sidewalls of the gate electrode and the gate dielectric, forming a recess in the semiconductor adjacent the spacer, and depositing SiGe in the recess to form a SiGe stressor. The method further includes etching the SiGe stressor to improve the uniformity of SiGe stressors.

23 Claims, 5 Drawing Sheets

RESOLVING PATTERN-LOADING ISSUES OF SIGE STRESSOR

TECHNICAL FIELD

This invention relates generally to semiconductor devices, and more particularly to a method of manufacturing PMOS devices with SiGe stressors.

BACKGROUND

Reduction of the size and the inherent features of semiconductor devices (e.g., a metal-oxide semiconductor field-effect transistor) has enabled continued improvement in speed, performance, density, and cost per unit function of integrated circuits over the past few decades. In accordance with a design of the transistor and one of the inherent characteristics thereof, modulating the length of a channel region underlying a gate between a source and drain of the transistor alters a resistance associated with the channel region, thereby affecting performance of the transistor. More specifically, shortening the length of the channel region reduces a source-to-drain resistance of the transistor, which, assuming other parameters are maintained relatively constant, may allow an increase in current flow between the source and drain when a sufficient voltage is applied to the gate of the transistor.

To further enhance the performance of MOS devices, stress may be introduced in the channel region of a MOS transistor to improve carrier mobility. Generally, it is desirable to induce a tensile stress in the channel region of an n-type metal-oxide-semiconductor ("NMOS") device in a source-to-drain direction, and to induce a compressive stress in the channel region of a p-type metal-oxide-semiconductor ("PMOS") device in a source-to-drain direction.

A commonly used method for applying compressive stress to the channel regions of PMOS devices is growing SiGe stressors in the source and drain regions. Such a method typically includes the steps of forming a gate stack on a semiconductor substrate, forming spacers on sidewalls of the gate stack, forming recesses in the silicon substrate along gate spacers, epitaxially growing SiGe stressors in the recesses and annealing. Since SiGe has a greater lattice constant than silicon, it expands after annealing and applies a compressive stress to the channel region, which is located between a source SiGe stressor and a drain SiGe stressor.

The above-discussed method, however, suffers the drawback of pattern-loading effects, which occur due to a difference in pattern densities. The pattern-loading effects pertain to a phenomenon occurring upon simultaneous epitaxial growth in a region of a higher density and a region of a lower density. Due to a difference in growth rates of a film from one location to another, the amount of growth becomes locally dense or sparse depending on the local pattern density, and this causes non-uniformity in the thickness of the resulting film. Large variations in effective pattern density have been shown to result in significant and undesirable film thickness variation. For example, isolated active regions that are surrounded by regions having a large area ratio of dielectrics (meaning less surface area for the epitaxial growth) would have faster growth of the EPI layer than dense active regions. In addition, the composition of the EPI layer at the isolated active regions is also different from that of densely packed active regions. Particularly, this non-uniformity makes device formation process hard to control and device performance may be adversely affected.

The pattern-loading effects can be reduced by adjusting epitaxy parameters, such as reducing the process pressure or adjusting precursor flow rates. However, as a side effect, other epitaxy properties, such as composition, are also impacted by the changes of the pressure and gas flow rate. Additionally, the amount of reduction of the pattern-loading effects using this method is not satisfactory.

To effectively counteract the pattern-loading effect of SiGe growth, a layout design step known as a dummy pattern is used, wherein the circuit layout is modified and dummy patterns are added to locations with low pattern density. For selective epitaxial growth, dummy patterns are formed in sparse pattern regions over the dielectric material covering the regions. They are typically formed of materials similar to the material where growth is to occur. Selective epitaxial growth occurs on both desired regions and dummy patterns. The adding of dummy patterns helps in achieving more uniform pattern density across the wafer, thereby reducing pattern-loading effects. This method provides better results. However, additional process steps, hence higher costs, are involved. SiGe dummy patterns have to be formed in selective locations to make the density of the silicon patterns uniform.

Accordingly, what is needed in the art is a method for forming PMOS devices that may incorporate SiGe stressors to take advantage of the benefits associated with compressive stress while at the same time overcoming the deficiencies of the prior art.

SUMMARY OF THE INVENTION

The preferred embodiments of the present invention provide a method of improving uniformity of stressors formed in MOS devices.

In accordance with one aspect of the present invention, the method includes forming a gate dielectric over a semiconductor substrate, forming a gate electrode on the gate dielectric, forming a spacer on respective sidewalls of the gate electrode and the gate dielectric, forming a recess in the semiconductor substrate substantially aligned with an edge of the spacer, and depositing SiGe in the recess to form a SiGe stressor. The method further includes etching the SiGe stressor to improve the thickness uniformity of the SiGe stressors.

In accordance with another aspect of the present invention, the method includes providing a semiconductor substrate including a dense region and an iso (isolated) region, forming a first gate dielectric in the dense region and a second gate dielectric in the iso region over the semiconductor substrate, forming a first gate electrode on the first gate dielectric and a second gate electrode on the second gate dielectric, forming first spacers on opposing sidewalls of the first gate electrode and the first gate dielectric and second spacers on opposing sidewalls of the second gate electrode and the second gate dielectric, forming first recesses in the semiconductor substrate substantially aligned with edges of the first spacers, forming second recesses in the semiconductor substrate substantially aligned with edges of the second spacers, depositing first SiGe stressors in the first recesses and second SiGe stressors in the second recesses wherein the second SiGe stressors have a greater growth rate than the first stressors, and etching the first and the second stressors to substantially reduce a difference in thickness between the first and the second SiGe stressors. The second SiGe stressors have a substantially greater etching rate than the first SiGe stressors.

The advantageous features of the preferred embodiments of the present invention include more uniform SiGe stressor formation, adjustable facets of SiGe stressors, and minimal extra cost.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for forming PMOS devices with stressed channel regions is provided to solve pattern-loading effects (iso-dense effects) between densely patterned regions and sparsely patterned regions. The intermediate stages of manufacturing a preferred embodiment of the present invention are illustrated. Throughout the various views and illustrative embodiments of the present invention, like reference numbers are used to designate like elements.

Figure 1:
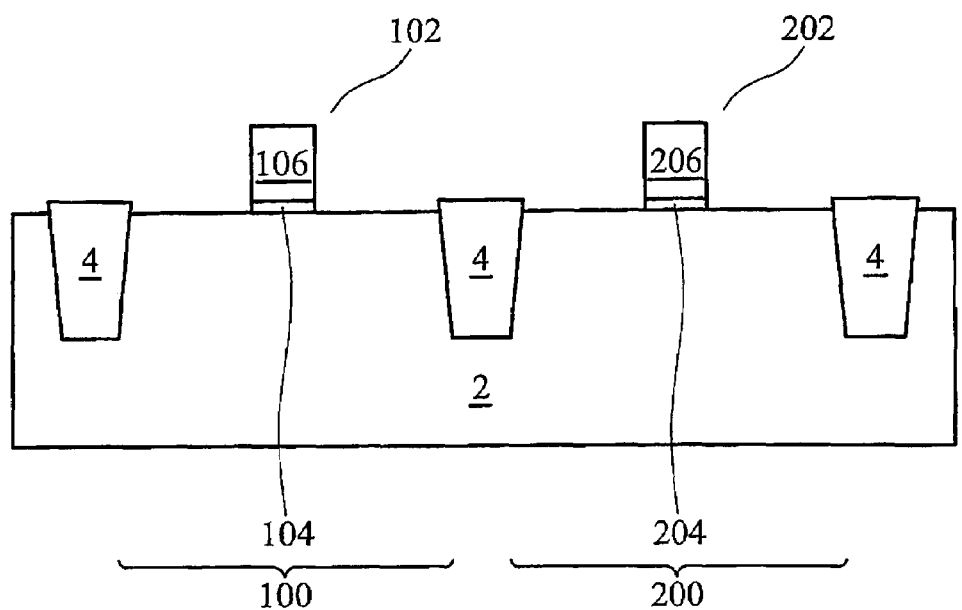
FIGS. 1 through 9 are cross-sectional views of intermediate stages in the manufacture of PMOS devices.

FIG. 1 illustrates a substrate 2 including a first device region 100 and a second device region 200, wherein device region 100 is a densely patterned region and device region 200 is a sparsely patterned region. Throughout the description, device regions 100 and 200 are alternatively referred to as dense region 100 and iso region 200, respectively. In the preferred embodiment, region 100 has a substantially higher PMOS device density than region 200. In other embodiments, the sizes of the active regions in device regions 100 and 200 are different, thus causing the iso-dense effects. Shallow trench isolation (STI) regions 4 are formed to isolate device regions. Preferably, substrate 2 comprises bulk silicon. Alternatively, substrate 2 comprises bulk SiGe or other semiconductor materials. Substrate 2 may also have a composite structure, such as silicon on insulator (SOI).

A first gate stack 102 comprising a gate dielectric 104 and a gate electrode 106 is formed in device region 100, and a second gate stack 202 comprising a gate dielectric 204 and a gate electrode 206 is formed in device region 200. The gate dielectrics 104 and 204 preferably have high k values. Gate electrodes 106 and 206 may include commonly used conductive materials such as doped polysilicon, metals, metal nitrides, and combinations thereof.

Figure 2:
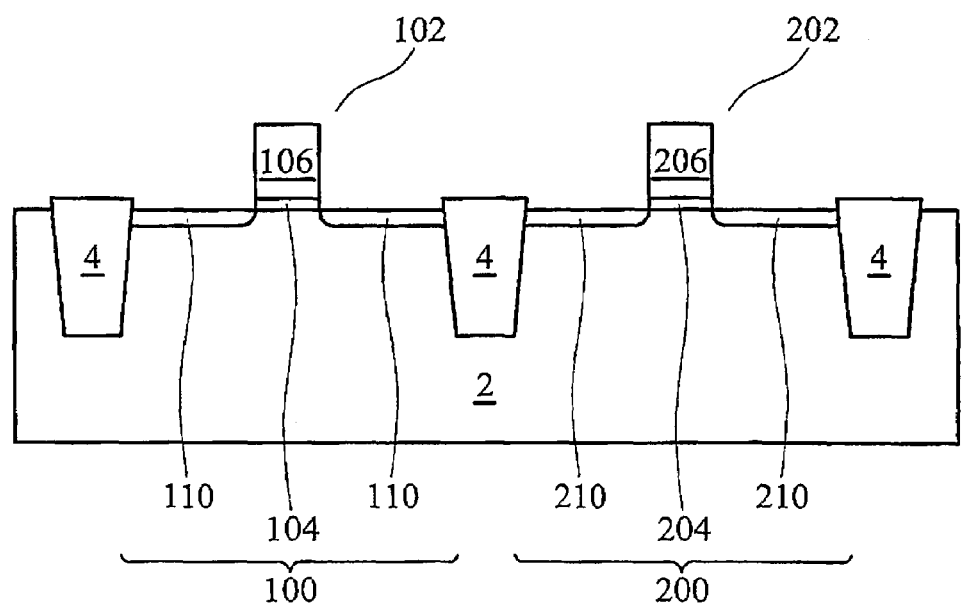

Lightly doped drain/source (LDD) regions 110 and 210 are formed, preferably by implanting a p-type impurity, as shown in FIG. 2. The gate stacks 102 and 202 act as masks so that LDD regions 110 and 210 are substantially aligned with the edges of the respective gate stacks 102 and 202.

Figure 3:
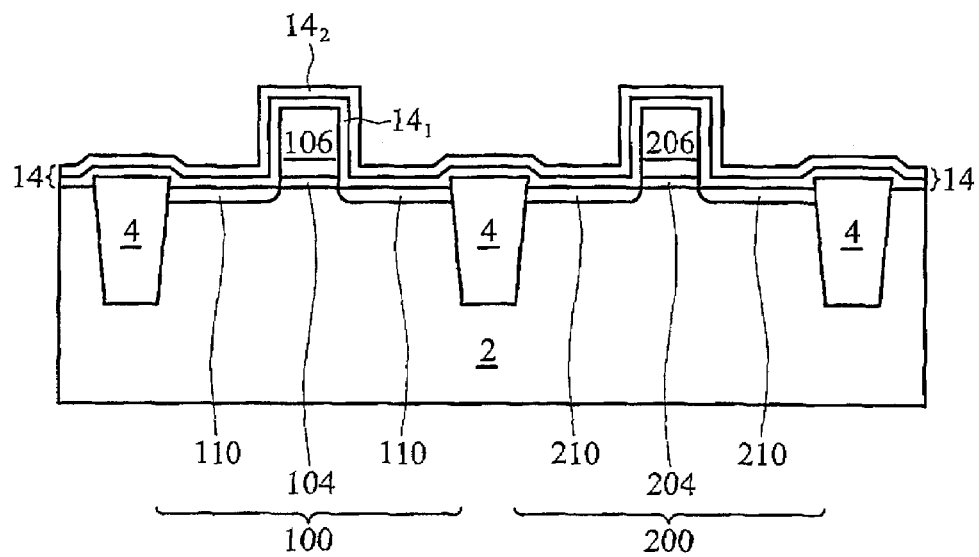

Referring to FIG. 3, a gate spacer layer 14 is formed. In the preferred embodiment, the gate spacer layer 14 includes a liner oxide layer $14_1$ and a nitride layer $14_2$. In alternative embodiments, the gate spacer layer 14 may include one or more layers, each comprising oxide, silicon nitride, silicon oxynitride (SiON) and/or other dielectric materials, and may be formed using commonly used techniques, such as plasma enhanced chemical vapor deposition (PECVD), low-pressure chemical vapor deposition (LPCVD), sub-atmospheric chemical vapor deposition (SACVD), etc.

Figure 4:
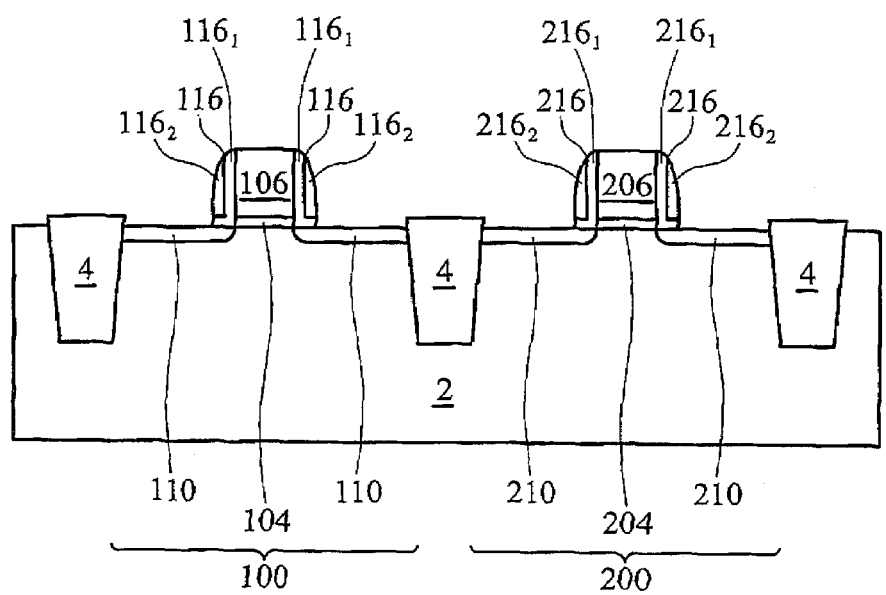

FIG. 4 illustrates the patterning of gate spacer layer 14 to form gate spacers 116 and 216, wherein the patterning may be performed by either wet etching or dry etching. The remaining portions of the liner oxide layer $14_1$ and the nitride layer $14_2$ form liner oxide portions $116_1$ and $216_1$ and nitride portions $116_2$ and $216_2$, respectively.

Figure 5:
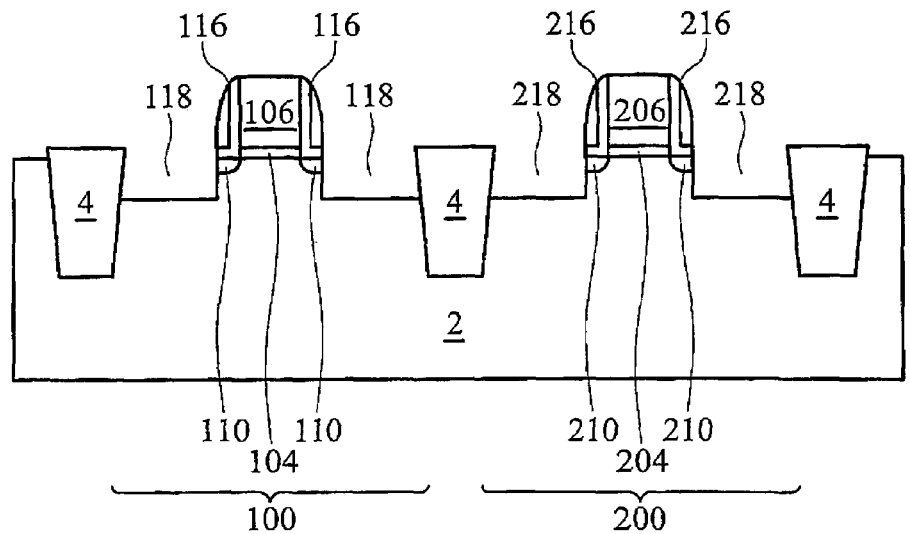

Referring to FIG. 5, recesses 118/218 are formed along the edges of spacers 116 and 216, preferably by etching isotropically or anisotropically. In 90 nm technology, the preferred depth of the recesses 118 and 218 is between about 500 Å and about 1000 Å, and more preferably between about 700 Å and 900 Å.

Figure 6:
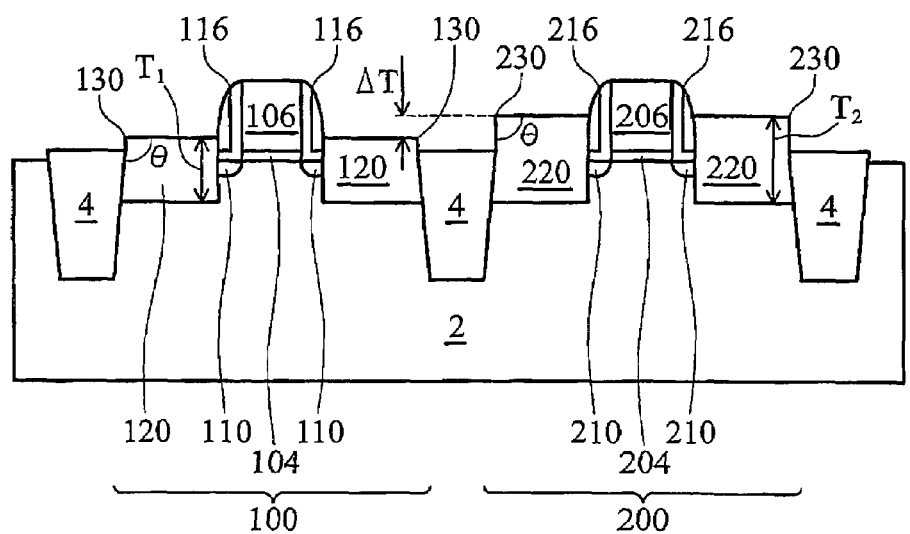

FIG. 6 illustrates the formation of epitaxy regions. A semiconductor material, preferably SiGe, is epitaxially grown in recesses 118 and 218 by selective epitaxial growth (SEG), forming epitaxial regions 120 and 220. The semiconductor material preferably has a greater lattice spacing than the silicon substrate 2. Desired impurities may be doped while the growth proceeds. In the preferred embodiment wherein substrate 2 is a silicon substrate, SiGe is grown in the recesses 118 and 218. In other embodiments wherein substrate 2 comprises SiGe, it is preferred that SiGe epitaxial regions 120 and 220 comprise more germanium than in substrate 2, so that the lattice spacing in SiGe epitaxial regions 120 and 220 is greater than in substrate 2. After being annealed, the SiGe will try to restore its lattice spacing, thus introducing a compressive stress to the channel region. Throughout the description, SiGe epitaxial regions 120 and 220 are alternatively referred to as SiGe stressors 120 and 220, respectively.

As noted, the formation methods of SiGe preferably include epitaxial growth. The precursor for depositing SiGe preferably includes $GeH_4$, dichlorosilane ($SiH_2Cl_2$), and the like. More preferably, an etching gas HCl is introduced for the effect of reducing pattern-loading effects. In an exemplary embodiment, the SiGe epitaxy is performed using PECYD in a chamber, in which the pressure is preferably between about 5 and about 20 torr, and more preferably between about 5 and 10 torr. The preferred temperature is between about 500° C. and about 800° C., and more preferably between about 500° C. and about 650° C.

Due to pattern-loading effects, SiGe stressors 120 in dense region 100 have a lower growth rate than SiGe stressors 220 in iso region 200. Accordingly, SiGe stressors 120 have a smaller thickness $T_1$ than the thickness $T_2$ of SiGe stressors 220. The difference in thicknesses causes difficulty in subsequent device fabrication processes and may adversely affect device performance, thus is undesired.

Figure 7A:
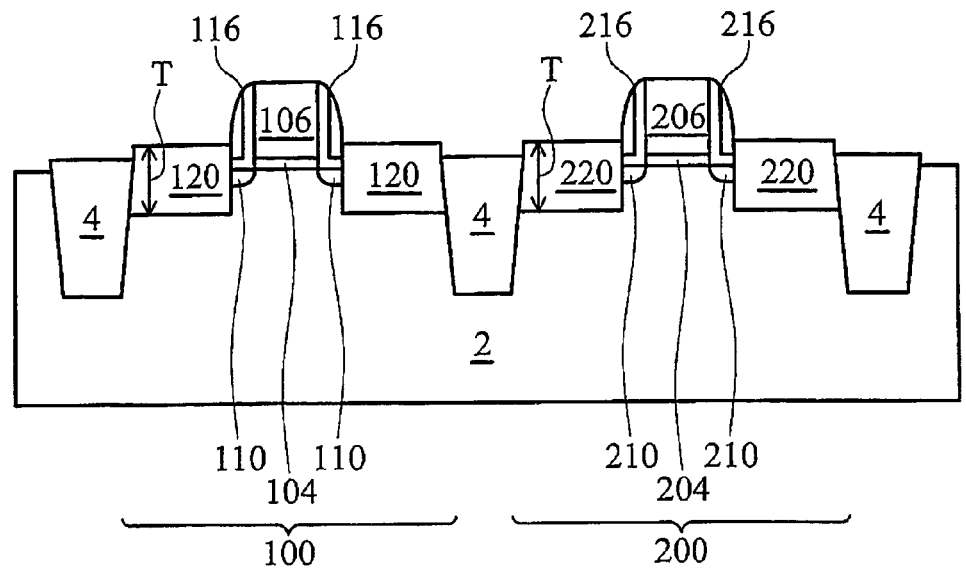

In the preferred embodiment, the thicknesses $T_1$ and $T_2$ are preferably greater than the desired (target) thickness T (not shown in FIG. 6, refer to FIG. 7A). An etch-back is then performed to thin SiGe stressors 120 and 220. Preferably, dry etching is performed, and the etch gases include fluorine-containing etching gases such as HF, chlorine-containing etching gases such as HCl, bromine-containing etching gases such as HBr, and the like.

During the etch-back process, desirable reversed pattern-loading effects occur, wherein an etching rate in dense region 100 is lower than in iso region 200. This causes a desired reduction of the thickness difference ΔT between the SiGe stressors 120 and 220. Preferably, when portions of the SiGe stressors 120 are thinned to the desired thickness T, more SiGe stressor 220 is thinned, and SiGe stressors 220 also have a thickness T.

The above-discussed case, however, is ideal and may not occur without fine-tuning the etch-back process. It often occurs that although the etching rate of SiGe stressors 220 is greater than the etching rate of SiGe stressors 120, the difference in etching rate is not significant enough to substantially eliminate the thickness difference ΔT when SiGe stressors 120 reach the thickness T. The etching process is thus preferably adjusted to control the etching rates in device dense region 100 and/or device iso region 200. Assuming the deposition of SiGe stressors 120 has a first rate, the deposition of SiGe stressors 220 has a second rate, the etching of SiGe stressors 120 has a third rate, and the etching of SiGe stressors 220 has a fourth rate, then it is preferred that the ratio of the fourth rate to the third rate is substantially greater than a ratio of the second rate to the first rate.

In the preferred embodiment, the etching rates can be adjusted by adding passivation materials, for example, polymer-like materials, to retard etching in iso region 200. In an exemplary embodiment, carbon-rich gases may be added into the chamber. As a result, passivation materials such as carbon fluoride ($C_xF_y$) are generated, wherein $C_xF_y$ includes $CF_4$, $C_2F_6$, $C_3F_8$, and the like. Carbon fluoride tends to attach to the sidewalls and the bottom of the SiGe stressors in iso regions, thus the difference in etching rates is thus increased.

Preferably, etch-back is performed in-situ with the epitaxial growth process, although etch-back and epitaxial growth can be performed in different environments. The additional etch-back thus has little extra cost involved, and throughput is not significantly affected.

In the preferred embodiment, SiGe stressors 120 and 220 are overgrown and etched back to the desired thickness in one grow-etch cycle. In other embodiments, the formation of SiGe stressors 120 and 220 includes multiple cycles of deposition and etch-back (hence the name deposition-etch-deposition, or DED) to achieve more uniform SiGe growth. Multiple rounds of deposition and etch-back may have the same or different process parameters.

Preferably, the etch-back process is started after the thicknesses $T_1$ and $T_2$ of the respective SiGe stressors 120 and 220 have exceeded the target thickness T. Alternatively, the etch-back process is started before the thicknesses $T_1$ and $T_2$ of the respective SiGe stressors 120 and 220 have reached the target thickness T, and additional cycles are needed to further increase the thicknesses of the SiGe stressors 120 and 220. In yet other embodiments, the etch-back process reduces the thicknesses of SiGe stressors from values greater than the target thickness T to values less than the target thickness T, and further cycles increase the thicknesses while improving uniformity. One skilled in the art will realize that more combinations exist, and an optimum combination may be found through routine experiments.

Besides controlling uniformity for dense and iso regions, etch-back processes can also be used to adjust the facet of the SiGe regions. By adjusting the etching parameters, the facet, such as the angle θ and the roundness of the corners 130 and 230 of the SiGe regions, may be adjusted.

FIG. 7A illustrates a structure after DED cycles, wherein the thicknesses T of SiGe stressors 120 and 220 are substantially uniform.

Figure 7B:
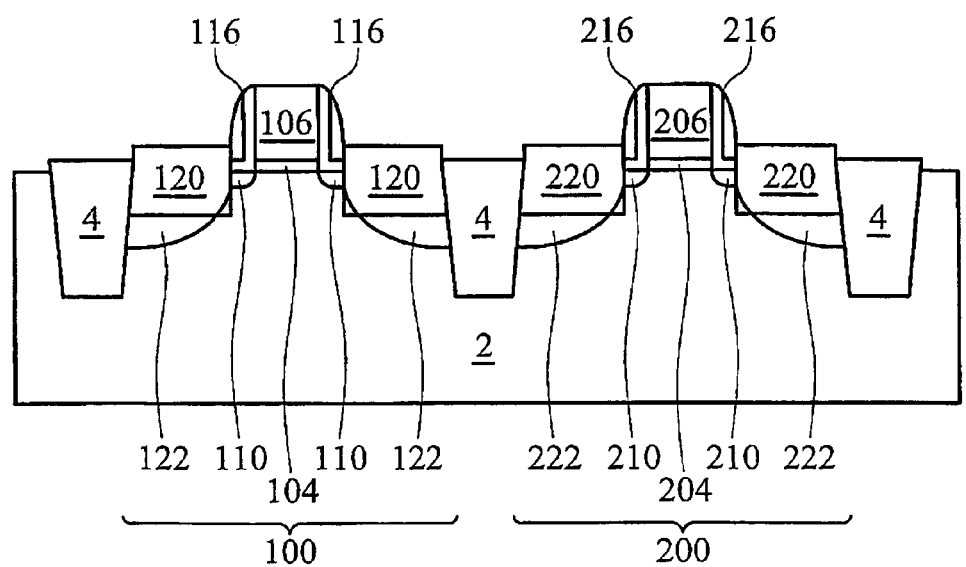

In the preferred embodiment, SiGe stressors 120 and 220 are doped with a p-type impurity during the epitaxial growth, thus forming the source/drain regions of the respective PMOS devices. However, if desired, SiGe stressors 120 and 220 can be further doped with a p-type impurity, as shown in FIG. 7B, wherein doped regions are shown as regions 122 and 222.

Figure 8:
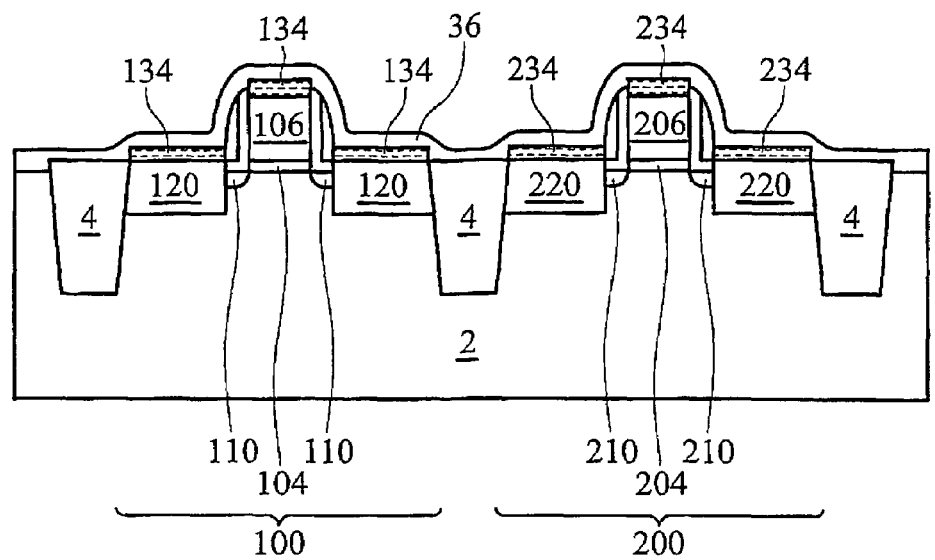

FIG. 8 illustrates the formation of silicide regions 134 and 234 and an etch stop layer (ESL) 36. As is known in the art, silicide regions 134 and 234 are preferably formed by depositing a thin layer of metal, such as titanium, cobalt, nickel, tungsten, or the like, over the devices, including the exposed surfaces of SiGe stressors 120 and 220 and gate electrode 106 and 206. The substrate is then heated, which causes the silicide reaction to occur wherever the metal is in contact with silicon. After reaction, a layer of metal silicide is formed between silicon and metal. The un-reacted metal is selectively removed through the use of an etchant that attacks metal but does not attack silicide.

The ESL 36 is blanket deposited over the device. ESL 36 may be formed using low-pressure chemical vapor deposition (LPCVD), but other CVD methods, such as plasma enhanced chemical vapor deposition (PECVD), and thermal CVD may also be used. Preferably, ESL 36 has an inherent compressive stress, thus applying a compressive stress to the channel regions of the PMOS devices.

Figure 9:
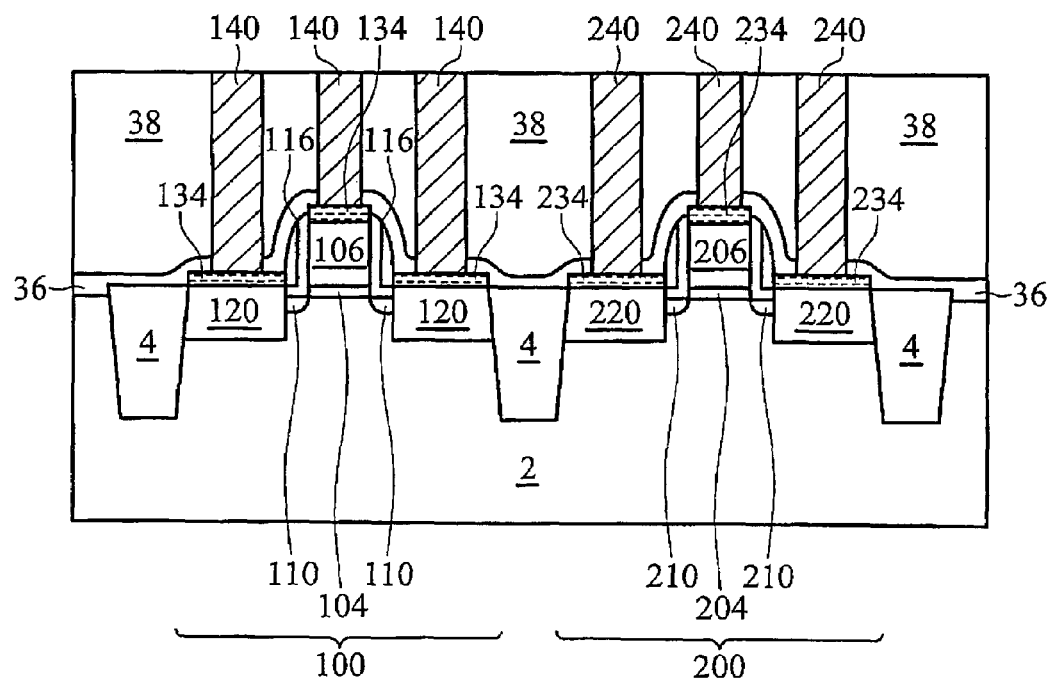

Referring to FIG. 9, an inter-level dielectric (ILD) layer 38 is next deposited over the surface of the structure formed in previous steps. ILD layer 38 is preferably a low-k material or a silicon dioxide deposited using, e.g., high-density plasma CVD (HDP-CVD), LPCVD, or other well-known deposition techniques. ILD layer 38 provides insulation between MOS devices and overlying metal lines. ESL 36 operates as an etch stop layer during the etching of ILD layer 38 and thus protects the underlying silicide regions 134 and 234. Additionally, with ESL 36, process control and end-point detection are more closely controlled, thus limiting the likelihood of over-etching through the underlying silicide regions 134 and 234. Contact plugs 140 and 240 are then formed providing access to the source/drain region and gate electrodes through silicide regions 134 and 234.

The preferred embodiments of the present invention have several advantageous features. By reducing pattern-loading effects through DED processes, more uniform formation of SiGe stressors is achieved. The facets of the SiGe stressor can be adjusted. Additionally, the preferred embodiments of the present invention can be performed in-situ with the deposition process, thus minimal extra cost is involved.

The previously illustrated preferred embodiments have shown symmetrical devices. In other embodiments, the source/drain regions can be asymmetric. Furthermore, the concept of using etch back for reducing pattern-loading effects can be used on the formation of stressors comprising other elements, such as stressors comprising SiC, SiGeC, etc. One skilled in the art will be able to find optimum processes through routine experiments by applying the concept taught by the preferred embodiments of the present invention.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a semiconductor structure, the method comprising:
   providing a semiconductor substrate;
   forming a first gate stack and a second gate stack over the semiconductor substrate;
   forming recesses in the semiconductor substrate on opposing sides of the first gate stack and the second gate stack;
   depositing SiGe in the recesses to form a first SiGe stressor on opposing sides of the first gate stack and a second SiGe stressor on opposing sides of the second gate stack; and
   etching the first and the second SiGe stressors to reduce a thickness of the first and the second SiGe stressors, wherein the first SiGe stressor has a greater etching rate than the second SiGe stressor.

2. The method of claim 1, wherein the step of depositing SiGe in the recesses is performed using a gas selected from the group consisting essentially of GeH4, HCl, dichlorosilane, and combinations thereof.

3. The method of claim 1, wherein the step of etching the first and second SiGe stressors is performed using a gas selected from the group consisting essentially of fluorine-containing etching gases, chlorine-containing etching gases, bromine-containing etching gases, and combinations thereof.

4. The method of claim 1, wherein the step of etching the first and second SiGe stressors further comprises adjusting etching parameters to adjust a relative etching rate of the first SiGe stressor to the second SiGe stressor.

5. The method of claim 4, wherein the step of adjusting etching parameters includes introducing a carbon-rich gas.

6. The method of claim 1 further comprising depositing additional SiGe on the first and second SiGe stressors after the step of etching the first and second SiGe stressors.

7. The method of claim 6 further comprising etching the additional SiGe after the step of depositing the additional SiGe.

8. The method of claim 1, wherein the step of etching the first and second SiGe stressors is performed before the first and second SiGe stressors reach a target thickness.

9. The method of claim 1, wherein the step of etching the first and second SiGe stressors is performed after the first and second SiGe stressors reach a target thickness.

10. A method for forming a semiconductor structure, the method comprising:
    providing a semiconductor substrate including a dense region and an iso region;
    forming a first gate dielectric in the dense region and a second gate dielectric in the iso region;
    forming a first gate electrode on the first gate dielectric and a second gate electrode on the second gate dielectric;
    forming a first spacer on a sidewall of the first gate electrode and the first gate dielectric and a second spacer on a sidewall of the second gate electrode and the second gate dielectric;
    forming a first recess in the semiconductor substrate substantially aligned with an edge of the first spacer and a second recess in the semiconductor substrate substantially aligned with an edge of the second spacer;
    epitaxially growing a first SiGe stressor in the first recess and a second SiGe stressor in the second recess, the second SiGe stressor having a greater growth rate than the first stressor; and
    etching the first and the second stressors to substantially reduce a difference in thickness between the first and the second SiGe stressors, wherein the second SiGe stressor has a substantially greater etching rate than the first SiGe stressor.

11. The method of claim 10, wherein the step of epitaxially growing the first and the second SiGe stressors is performed using a gas selected from the group consisting essentially of GeH4, HCl, dichlorosilane, and combinations thereof.

12. The method of claim 11, wherein after the step of etching the first and the SiGe second stressors, at least one of the first and the second SiGe stressors has a thickness of greater than a target thickness.

13. The method of claim 11, wherein after the step of etching the first and the SiGe second stressors, at least one of the first and the second SiGe stressors has a thickness of less than a target thickness.

14. The method of claim 10, wherein the step of etching the first and the second SiGe stressors is performed using a gas selected from the group consisting essentially of fluorine-containing etching gases, chlorine-containing etching gases, bromine-containing etching gases, and combinations thereof.

15. The method of claim 10, wherein the step of etching the first and the second SiGe stressors further comprises adjusting etching parameters to adjust a ratio of a rate for etching the first SiGe stressor to a rate of etching the second SiGe Stressor.

16. The method of claim 15, wherein the step of adjusting etching parameters includes introducing a carbon-rich gas during the step of etching the first and the second SiGe stressors.

17. The method of claim 10 further comprising at least one additional cycle of growing and etching the first and the second SiGe stressors.

18. The method of claim 10, wherein the growing the first SiGe stressor has a first rate, the growing the second SiGe stressor has a second rate, the etching the first SiGe stressor has a third rate, the etching the second SiGe stressor has a fourth rate, and wherein a ratio of the second rate to the first rate is substantially less than a ratio of the fourth rate to the third rate.

19. A method for forming a semiconductor structure, the method comprising:
    providing a semiconductor substrate; and
    forming a SiGe stressor in a source/drain region of a first and a second PMOS device comprising:
      forming a recess in the source/drain region of the first and the second PMOS devices; and
      performing at least one cycle, wherein each cycle comprises:
        depositing SiGe in the recesses of the first and the second PMOS devices to increase a thickness of the SiGe stressor; and
        etching the SiGe stressor in the source/drain region of the first and the second PMOS devices to reduce the thickness, wherein SiGe has a different growth rate in the recess of the first PMOS device than in the recess of the second PMOS device.

20. The method of claim 19, wherein the step of etching the SiGe stressor is performed using a gas selected from the group consisting essentially of fluorine-containing etching gases, chlorine-containing etching gases, bromine-containing etching gases, and combinations thereof.

21. The method of claim 19, wherein the step of etching the SiGe stressor further comprises adjusting etching parameters to adjust an etching rate.

22. The method of claim 21, wherein the step of adjusting the etching parameters includes introducing a carbon-rich gas during the step of etching the SiGe stressor.

23. The method of claim 19 further comprising at least one additional cycle of depositing and etching the SiGe stressor.

* * * * *